US010491206B2

(12) United States Patent
Jariwala et al.

(10) Patent No.: US 10,491,206 B2
(45) Date of Patent: Nov. 26, 2019

(54) SYSTEM AND METHOD FOR ANTI-AMBIPOLAR HETEROJUNCTIONS FROM SOLUTION-PROCESSED SEMICONDUCTORS

(71) Applicant: Northwestern University, Evanston, IL (US)

(72) Inventors: Deep M. Jariwala, Evanston, IL (US); Vinod K. Sangwan, Syracuse, NY (US); Weichao Xu, Minneapolis, MN (US); Hyungil Kim, Woodbury, MN (US); Tobin J. Marks, Evanston, IL (US); Mark C. Hersam, Wilmette, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 15/897,739

(22) Filed: Feb. 15, 2018

(65) Prior Publication Data

US 2018/0183423 A1    Jun. 28, 2018

Related U.S. Application Data

(62) Division of application No. 14/981,245, filed on Dec. 28, 2015, now Pat. No. 9,929,725.

(Continued)

(51) Int. Cl.
*H03K 7/06* (2006.01)
*H01L 51/00* (2006.01)
(Continued)

(52) U.S. Cl.
CPC ............ *H03K 7/06* (2013.01); *H01L 27/283* (2013.01); *H01L 27/286* (2013.01);
(Continued)

(58) Field of Classification Search
CPC ....... H03K 7/06; H01L 27/286; H01L 27/283; H01L 51/0003; H01L 51/105;
(Continued)

(56) References Cited

U.S. PATENT DOCUMENTS

2006/0186502 A1     8/2006   Shimotani et al.
2008/0212913 A1*    9/2008   Gill .................... G02F 1/025
                                                                385/2

(Continued)

OTHER PUBLICATIONS

Jariwala, et al., "Large-Area, Low-Voltage Antiambipolar Heterojunctions from Solution-Processed Semiconductors," Nano Letters, 2015, 15, p. 416-421.

(Continued)

*Primary Examiner* — Mohammed R Alam
(74) *Attorney, Agent, or Firm* — Benesch, Friedlander, Coplan & Aronoff LLP

(57) ABSTRACT

Van der Waals heterojunctions are extended to semiconducting p-type single-walled carbon nanotube (s-SWCNT) and n-type film that can be solution-processed with high spatial uniformity at the wafer scale. The resulting large-area, low-voltage p-n heterojunctions can exhibit anti-ambipolar transfer characteristics with high on/off ratios. The charge transport can be efficiently utilized in analog circuits such as frequency doublers and keying circuits that are widely used, for example, in telecommunication and wireless data transmission technologies.

20 Claims, 9 Drawing Sheets

Related U.S. Application Data

(60) Provisional application No. 62/101,676, filed on Jan. 9, 2015.

(51) Int. Cl.
*H01L 51/05* (2006.01)
*H01L 51/10* (2006.01)
*H01L 27/28* (2006.01)
*H01L 29/786* (2006.01)

(52) U.S. Cl.
CPC ...... *H01L 51/0003* (2013.01); *H01L 51/0017* (2013.01); *H01L 51/0048* (2013.01); *H01L 51/0562* (2013.01); *H01L 51/105* (2013.01); H01L 29/78693 (2013.01); H01L 51/0545 (2013.01); H01L 2251/303 (2013.01)

(58) Field of Classification Search
CPC ............. H01L 51/0562; H01L 51/0048; H01L 51/0017; H01L 29/78693; H01L 51/0545; H01L 2251/303
See application file for complete search history.

(56) References Cited

U.S. PATENT DOCUMENTS

2012/0223314 A1    9/2012   Marks et al.
2015/0034907 A1    2/2015   Hersam et al.

OTHER PUBLICATIONS

C-H Lee, et al., "Epitaxial Growth of Molecular Crystals on Van Der Waals Substrates for High-Performance Organic Electronics," Adv. Mater., 2014, 26 p. 2812-2817.

C-H Lee, et al., "Atomically Thin p-n Junctions with Van Der Waals Heterointerfaces," Nature Nanotechnology, 2014, 9, p. 676-681.

Y. Liu, et al., "Highly Flexible Electronics from Scalable Vertical Thin Film Transistors," Nano Letters, 2014, 14, p. 1413-1418.

J. Heo, et al., "Graphene and Thin-Film Semiconductor Heterojunction Transistors Integrated on Wafer Scale for Low-Power Electronics," Nano Letters, 2013, 13, p. 5967-5971.

D. Jariwala, et al., "Gate-tunable Carbon Nanotube-MoS2 Heterojunction p-n-Diode," PNAS, 2013, 110, p. 18076-18080.

Jariwala, et al., "Gate-tunable Carbon Nanotube-MoS2 Heterojunction p-n. Diode," Proceedings of the National Academy of Sciences, vol. 110, No. 45, Nov. 2013, p. 18076-18080.

\* cited by examiner

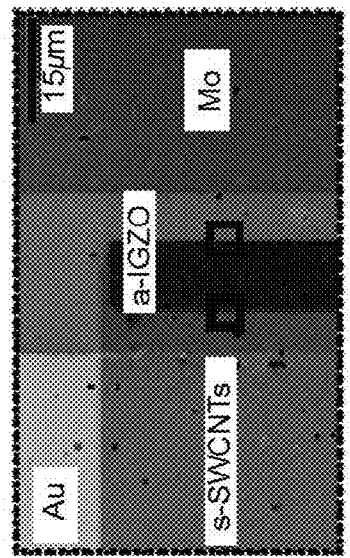
Figure 1A
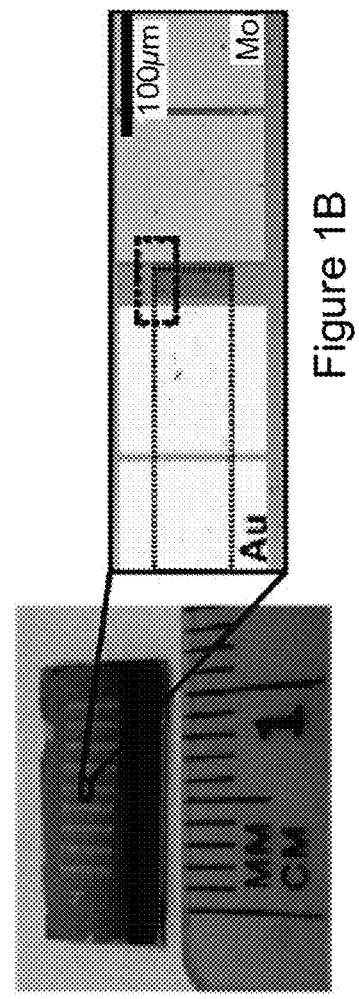
Figure 1B
Figure 1C
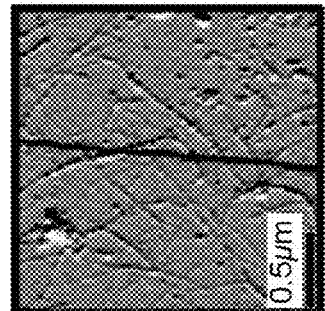
Figure 1F
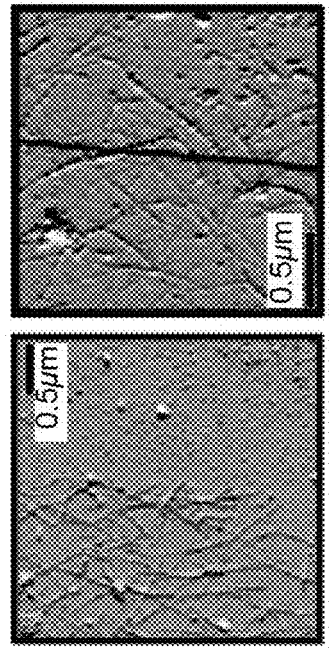
Figure 1E
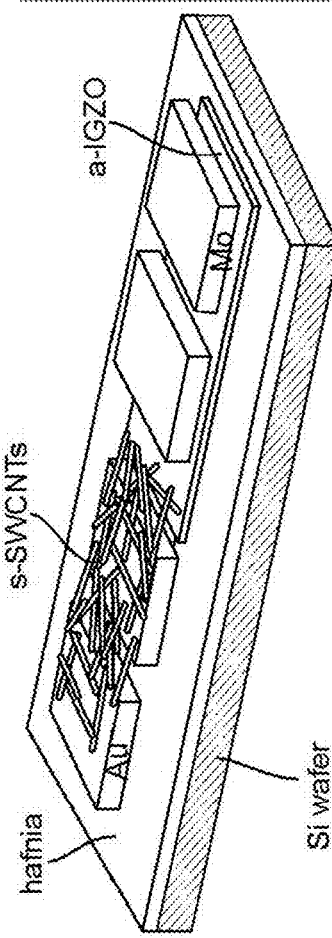
Figure 1D

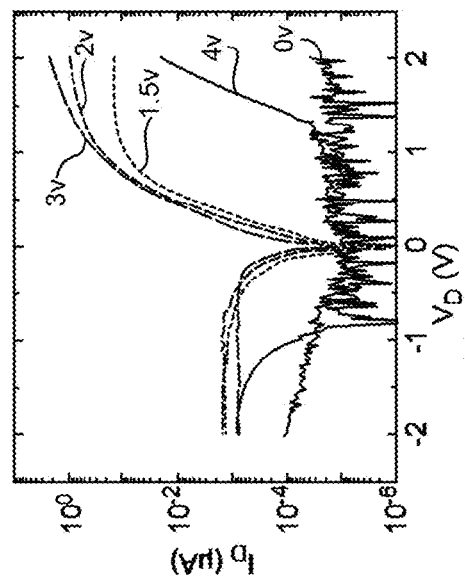
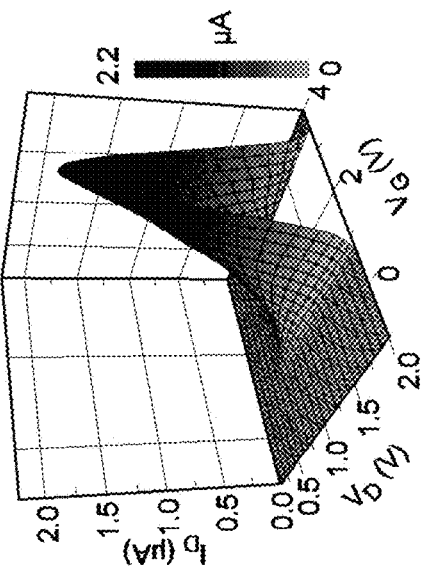
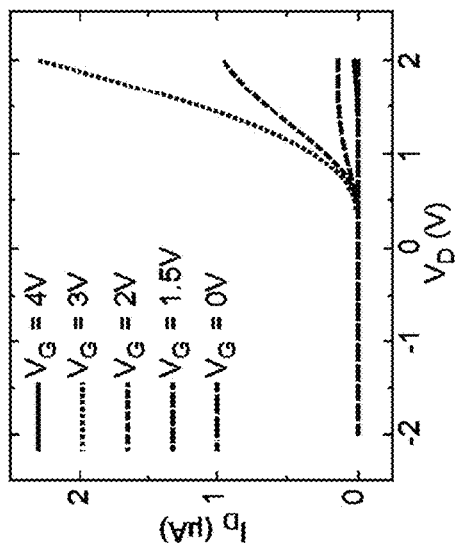
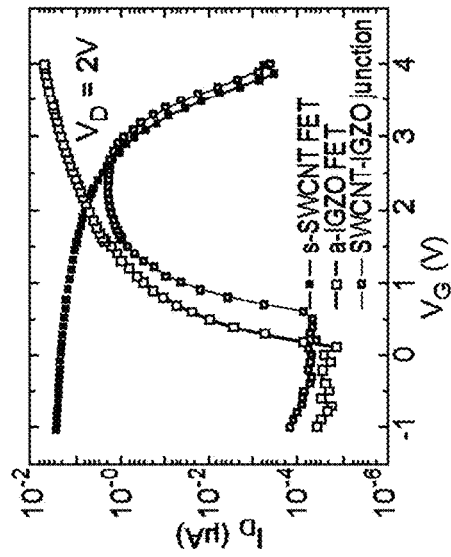
Figure 2A
Figure 2B
Figure 2C
Figure 2D

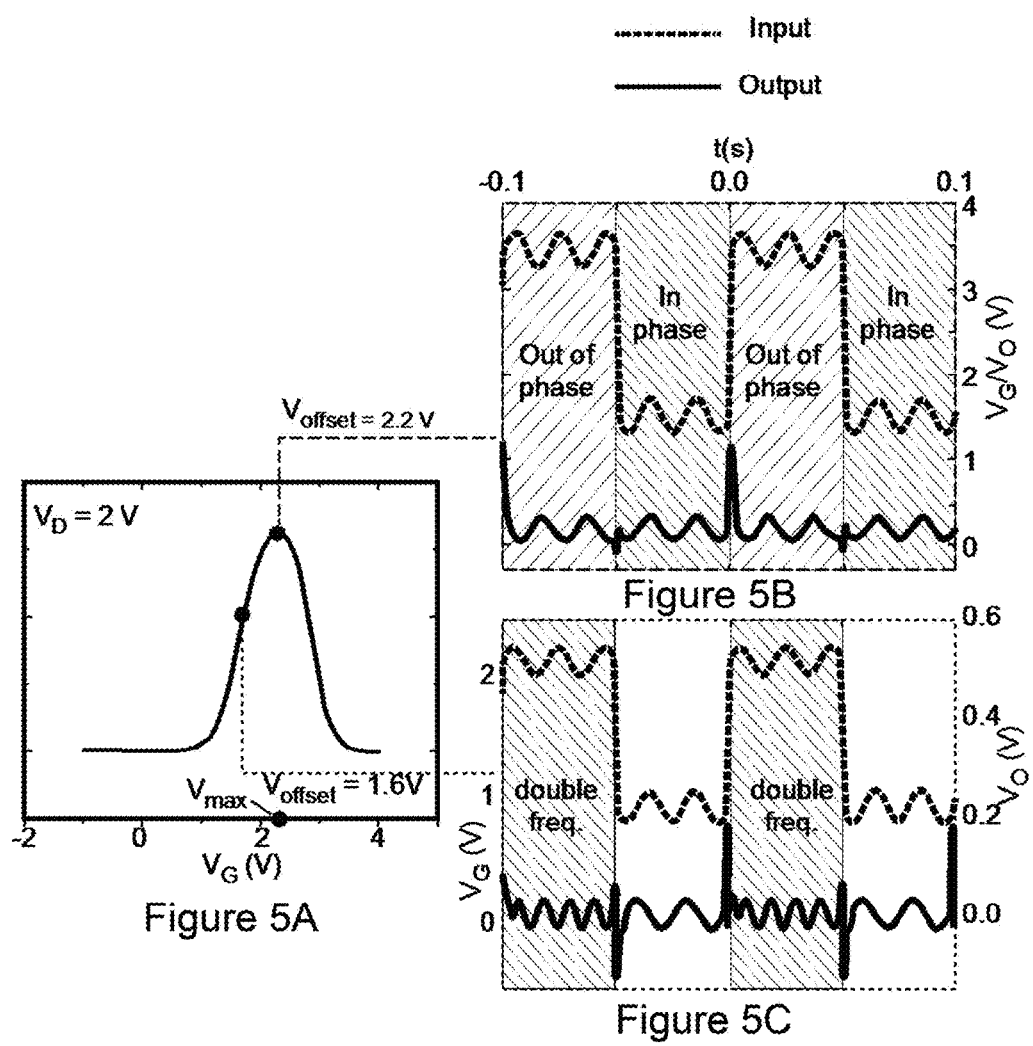

SYSTEM AND METHOD FOR ANTI-AMBIPOLAR HETEROJUNCTIONS FROM SOLUTION-PROCESSED SEMICONDUCTORS

CROSS-REFERENCE TO RELATED APPLICATION

This application is a divisional of U.S. patent application Ser. No. 14/981,245, filed Dec. 28, 2015, and claims the benefit of U.S. Provisional Application Ser. No. 62/101,676, filed Jan. 9, 2015, which are both incorporated in their entirety herein.

STATEMENT OF FEDERALLY FUNDED RESEARCH

This invention was made with government support under grant numbers DMR1006391 and DMR1121262 awarded by the National Science Foundation; grant number N00014-11-1-0690 awarded by the Office of Naval Research; and 70NANB14H012 awarded by the National Institute of Standards of Technology (NIST). The government has certain rights in the invention.

BACKGROUND

The emergence of semiconducting materials with inert or dangling bond-free surfaces has created opportunities to form van der Waals heterostructures without the constraints of traditional epitaxial growth. For example, layered two-dimensional (2D) semiconductors have been incorporated into heterostructure devices with gate-tunable electronic and optical functionalities. However, 2D materials present processing challenges that have prevented these heterostructures from being produced with sufficient scalability and/or homogeneity to enable their incorporation into large-area integrated circuits.

BRIEF DESCRIPTION OF DRAWINGS

FIGS. 1A-F are a diagram of an example structure of the s-SWCNT/a-IGZO p-n heterojunctions.

FIGS. 2A-D are graphs of example electrical properties of the s-SWCNT/a-IGZO anti-ambipolar p-n heterojunctions.

FIGS. 5A-C are graphs illustrating example phase and frequency shift keying using s-SWCNT/a-IGZO anti-ambipolar p-n heterojunctions.

DESCRIPTION

Figure 3A:
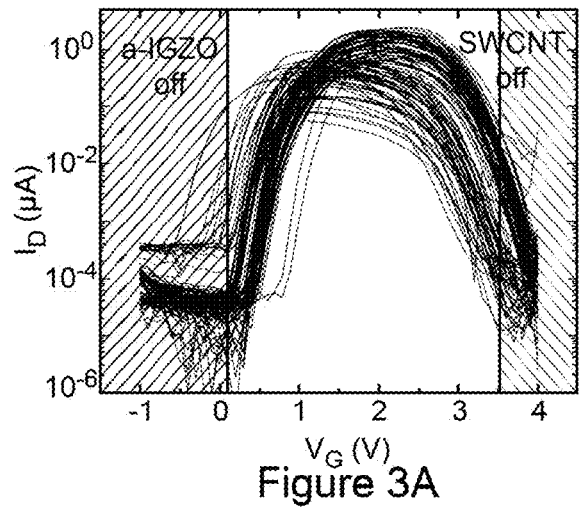
FIGS. 3A-C are graphs of example performance metric statistics of the s-SWCNT/a-IGZO anti-ambipolar p-n heterojunctions.

Van der Waals heterojunctions are extended to thin p-type and n-type materials, e.g., to semiconducting p-type nanotube, e.g., single-walled carbon nanotube (s-SWCNT) and n-type oxide, e.g., amorphous indium (In) gallium (Ga) zinc (Zn) oxide (O) (a-IGZO), thin films. Additionally or alternatively to the p-type nanotubes, other p-type organics including p-type conducting polymers can be used. The semiconductors can be solution-processed with high spatial uniformity at the wafer scale and/or include vapor deposited oxides, e.g., via chemical vapor deposition (CVD), sputtering and/or atomic layer deposition (ALD). Additionally or alternatively, the n-type oxides can be crystalline, e.g., ZnO or $In_2O_3$. The resulting large-area, low-voltage p-n heterojunctions can exhibit anti-ambipolar transfer characteristics with high on/off ratios. The charge transport can be efficiently utilized in analog circuits such as frequency doublers and keying circuits that are widely used, for example, in telecommunication and wireless data transmission technologies.

Gate tunable p-n heterojunctions can be created over large areas. The s-SWCNTs and a-IGZO interact via van der Waals bonding. These p-n heterojunctions show a unique transfer characteristic, which is termed anti-ambipolarity since it is the inverse of the ambipolar response. The circuits enabled by these heterojunctions can require a reduced number of circuit elements compared to the existing/conventional technology to achieve the same function, thereby reducing circuit complexity and allowing more efficient space management on a microchip. Implementations can include fabrication of anti-ambipolar p-n heterojunctions from solution-processed semiconductors over large areas and demonstrating reduced complexity analog circuits using the anti-ambipolar response compared to conventional unipolar transistor based technology. While conventional p-n diodes cannot be tuned by a capacitively coupled gate electrode, the p-n heterojunctions described herein can be tuned from insulating to a diode-like behavior using a gate potential.

FIGS. 1A-F are diagrams of an example structure of the s-SWCNT/a-IGZO p-n heterojunctions. FIG. 1A illustrates an optical image of a fully fabricated p-n heterojunction device array. FIG. 1B illustrates an expanded optical micrograph of a representative individual device in the array. From left to right there is a p-type s-SWCNT FET, s-SWCNT/a-IGZO p-n heterojunction, and n-type a-IGZO FET. The dashed outline indicates the patterned s-SWCNT thin film, while the dark rectangular region in the channel is the patterned a-IGZO thin film. FIG. 1C illustrates a false-color scanning electron microscopy (SEM) image of the dashed black outline in FIG. 1B. The different layers are colored and labeled. In this example, the Au electrode (drain) is biased while the Mo electrode (source) is grounded. FIG. 1D illustrates a schematic diagram of an individual unit of the array shown in FIG. 1A with appropriately labeled layers. FIGS. 1E-F illustrate atomic force micrographs (amplitude error) of the regions denoted by the green and purple squares in FIG. 1C. The patterned boundary of the s-SWCNT thin film is visible in FIG. 1E while the black line in FIG. 1F represents the patterned edge of the a-IGZO film. The scale is for example purposes and other scales may be used.

An inventory of layered 2D semiconductors with diverse electronic characteristics allows atomically thin and dimensionally abrupt heterostructures. Several device types including tunneling field-effect transistors (FETs), Schottky junctions, photovoltaic devices, p-n junction diodes, inverters, and non-volatile memory cells can include these van der Waals heterostructures. The weak interlayer bonding in these structures provides strain-free and defect-free interfaces without the constraints of epitaxy. Prominent among these phenomena is anti-ambipolarity, first observed in gate-tunable, carbon-nanotube/single-layer MoS2 p-n heterojunctions and more recently in 2D/2D p-n heterojunctions. While the examples above have employed layered 2D semiconductors using processing methods with limited scalability and uniformity, the concept of a van der Waals heterojunction are extended to any two materials with native oxide-free surfaces that do not covalently bond when brought in intimate contact. A scalable path is described to anti-ambipolar p-n heterojunctions by integrating two dissimilar solution-processable, air-stable materials: p-type s-SWCNTs and n-type a-IGZO. Conventional photolithography is used to fabricate large-area heterojunction arrays with high-k gate dielectrics, thereby providing low-voltage operation and device statistics at the cm2 level in one example.

Wafer-scale heterojunction p-n diodes can be fabricated using solution-processed, p-type s-SWCNTs and n-type a-IGZO thin films via standard photolithographic and etching techniques, FIG. 1A, and described in more detail in FIGS. 6 and 7A-F. The resulting device structure has an s-SWCNT FET, s-SWCNT/a-IGZO p-n heterojunction, and a-IGZO FET in series, FIG. 1B, from left to right. The p-n heterojunction region between the Mo and Au electrodes includes partially overlapping patterned a-IGZO and s-SWCNT films, FIGS. 1C-F. This device architecture enables electrical characterization of the p-n heterojunction in addition to control FETs from the individual semiconductors.

FIGS. 2A-D are graphs of example electrical properties of the s-SWCNT/a-IGZO anti-ambipolar p-n heterojunctions. In FIG. 2A-B, output characteristics of a representative device are illustrated at different gate voltages on linear (FIG. 2A) and semi-log (FIG. 2B) y-axis. The device is in a nearly insulating state at VG=4 V and 0 V, while it shows a highly rectifying state at the intermediate gate voltages. The weak gate modulation of the reverse saturation current magnitude can be seen in FIG. 2B. The plot colors in FIGS. 2A and B represent the same gate voltage values as indicated in the legend of FIG. 1A. In FIG. 1C, semi-log transfer characteristics are illustrated of a p-type s-SWCNT FET (blue), n-type a-IGZO FET (red), and s-SWCNT/a-IGZO p-n heterojunction (green). In FIG. 1D, a three-dimensional representation is illustrated of the anti-ambipolar transfer characteristics at varying drain biases. The grid lines running along the VD axis represent the forward output characteristics at the indicated gate voltage (VG).

In FIGS. 2A-B, show output curves of a representative p-n heterojunction at different gate biases (VG). Rectifying behavior is observed with rectification ratios exceeding 103 for VG=3 V, as described in further detail in FIG. 8. The forward current at VG=4 V is low (~20 nA) but abruptly increases for intermediate VG values and then falls to the instrumental noise floor (~10 pA) at VG=0 V. This behavior is also evident in the p-n heterojunction transfer plots (I-VG) (FIG. 1C, green). This anti-ambipolar transfer plot shows one current maximum (on-state) in between two off-states at either extremes of the gate voltage range. The voltage dependence of the anti-ambipolar plot is approximately a superposition of the transfer plots of the p-type and n-type unipolar FETs in red and blue, respectively (FIG. 2C). An anti-ambipolar response can also be produced by connecting the two unipolar FETs in series, described further in FIG. 9. This series geometry may present fabrication, scaling, and speed issues compared to the p-n heterojunction.

Due to screening from the ~20 nm thick a-IGZO, the junction itself is less modulated by the gate field compared to p-n heterojunctions based on 2D materials, thus simplifying the charge transport mechanism and facilitating the realization of reproducible and spatially homogeneous characteristics. For example, FIG. 2B, shows that the reverse saturation current possesses a relatively weak gate-dependence. In FIG. 2D, three-dimensional plots of current (ID) as a function of VG and forward bias voltage (VD) illustrate that the charge transport is primarily a result of two semiconductors with opposite carrier types in series. For example, cross-sections along the VD axis at VG>2.2 V (point of maximum current) resemble the output plots of s-SWCNT FETs under positive bias, whereas VG<2.2 V shows a saturating behavior that correlates with the output plots of a-IGZO FETs, as described further in FIGS. 10A-B. The VG dependence of the rectification ratios, band alignments, and further details on the conduction mechanism are discussed in FIG. 11. The large array of devices (FIG. 1A) enables assessment of the uniformity in performance by statistical means.

Figure 3B:
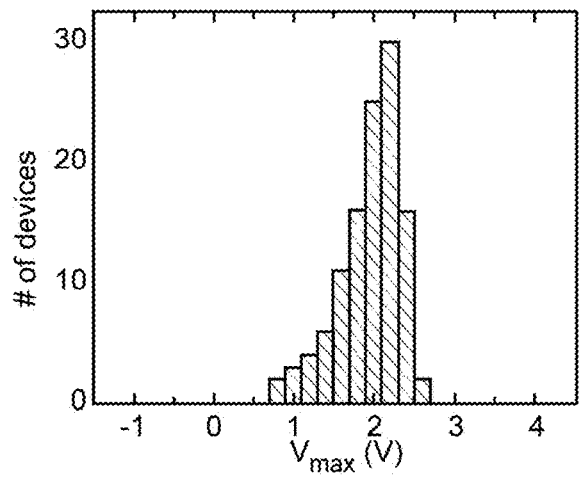
Figure 3C:
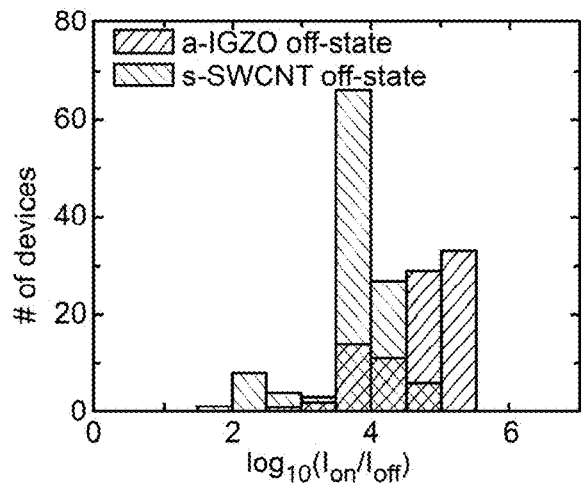

FIGS. 3A-C are graphs of example performance metric statistics of the s-SWCNT/a-IGZO anti-ambipolar p-n heterojunctions. FIG. 3A, illustrates anti-ambipolar transfer characteristics of 115 separate devices. Each curve has two off states and a current maximum (on-state) between them. FIG. 3B, illustrates an example histogram of the gate voltages corresponding to the current maxima (mean=1.89 V; standard deviation=0.38 V). FIG. 3C, illustrates example histograms of the on/off current ratios. The red and blue histograms correspond to the ratios derived using off-currents for the s-SWCNT (mean=3.76; standard deviation=0.94) and a-IGZO (mean=4.55; standard deviation=0.94), respectively. The average on/off ratio on the a-IGZO off side is higher due to the lower off-currents in the a-IGZO off-state as seen in FIG. 3A.

As observed in FIG. 3A, consistent anti-ambipolar behavior is observed among the 115 devices measured on two separate chips. Two important performance metrics for an anti-ambipolar device are the position of the current maximum in terms of gate voltage (Vmax) and the on/off current ratio. Since Vmax dictates the operational parameters of integrated circuits (vide infra), it can be important for this parameter to be spatially homogenous. In FIG. 3B, the histogram of Vmax peaks at 2.2 V with a tight distribution (the standard deviation is approximately 8% of the VG sweep range). Anti-ambipolar devices possess two off states, and thus FIG. 3C, provides two histograms for the on/off ratio. In both cases, the log10(Ion/Ioff) histograms have mean values>3 with relative standard deviations of 20% and 15% for the a-IGZO and s-SWCNT sides, respectively. The high (>1000) and consistent value of these on/off ratios suggests that these devices are suitable for digital electronic applications. Details on device dimensions and variations in the junction area in the array are discussed in FIG. 12.

Figure 4A:
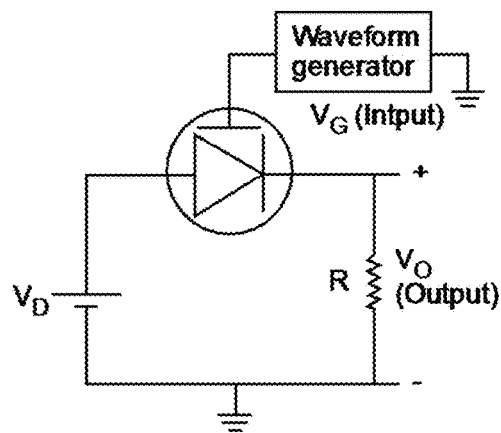
FIGS. 4A-C are a diagram of an example frequency doubling circuit based on s-SWCNT/a-IGZO anti-ambipolar p-n heterojunctions.
Figure 4B:
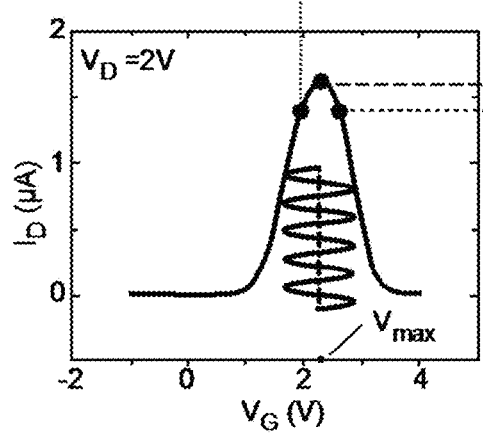
Figure 4C:
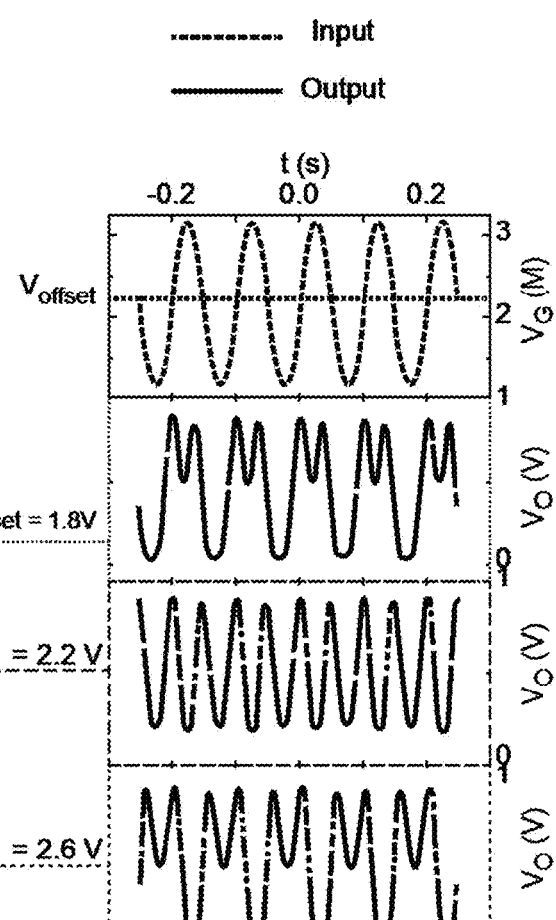

FIGS. 4A-C present a diagram of an example frequency doubling circuit based on s-SWCNT/a-IGZO anti-ambipolar p-n heterojunctions. In FIG. 4A, a schematic of the circuit is illustrated employing an anti-ambipolar heterojunction for frequency doubling. The circuit can use a single anti-ambipolar heterojunction in series with a resistor across which the output voltage (Vo) is measured using an oscilloscope. Series resistance R=1 MΩ. The resistance can be chosen to maintain an output voltage of 1 V when the junction resistance is minimized. In FIG. 4B, a representative transfer characteristic is illustrated of an anti-ambipolar heterojunction. The offset voltage that is applied to the sinusoidally varying input is indicated by the red circles. In FIG. 4C, input signal (black) and output signal (blue) are illustrated for the three different values of the offset voltage indicated in FIG. 4B. Complete frequency doubling is observed when Voffset=Vmax. More complicated signal conditioning occurs when Voffset is tuned away from Vmax.

An important characteristic of the anti-ambipolar response curve is the presence of positive and negative transconductances on the left and right side of the current maximum, respectively. The change in the sign of the transconductance can be exploited for analog circuit applications such as frequency doubling circuits (FIG. 4A). Frequency doubling (or multiplying) circuits have broad applications ranging from analog communications to radio astronomy and THz sensing. When an anti-ambipolar device is biased such that Voffset<Vmax, the transconductance is positive with the current (IDS) rising and the output voltage (Vo) across the resistor (R) increasing with the positive phase of the input signal. The case where Voffset>Vmax is similar except that the output signal is out of phase with the input since the input signal experiences a negative transconductance with increasing voltage. Also, when VG=Vmax, the transconductance is zero, resulting in local maxima and minima in the output signal whenever the input signal crosses Vmax in either direction. The overall effect is frequency doubling when Voffset is set equal to Vmax (FIG. 4C). If Voffset is moved away from Vmax, the frequency doubling is incomplete, which supports circuit operation model and enables further tunability of the output signal. Note also that the power spectral purity of the frequency doubled output signal is ~95% which exceeds the performance of graphene-based frequency doublers, described in more with regard to analysis of frequency doubling and binary phase shift keying circuits. Refinements such as scaling down device dimensions and local gating are likely to further enhance the anti-ambipolar frequency doubling performance, e.g., enabling higher operating frequencies.

Anti-ambipolarity facilitates the realization of other analog signal processing circuits including binary phase shift keying (BPSK) circuits that are used for passband data transmission in digital communication systems. These circuits map the conceptual symbols digital 0 and digital 1 into physical quantities that can be carried by alternating current (AC) signals. In this manner, binary phase shift keying (BPSK) is widely used for telecommunications and wireless data transmission technologies such as in the Institute of Electrical and Electronic Engineers (IEEE) 802.11 standard, commonly known as Wi-Fi. It functions to modulate the carrier AC signal with no phase shift for digital 0 transmission and with a 180° phase shift for digital 1 transmission. The input is typically a sine wave superimposed on a modulating square wave signal that possesses the desired data pattern.

FIGS. 5A-C is a graph illustrating example phase and frequency shift keying using s-SWCNT/a-IGZO anti-ambipolar p-n heterojunctions. In FIG. 5A, representative anti-ambipolar transfer characteristic are illustrated with the voltage offsets of the input signals (sine wave superimposed on modulating square waves) indicated by red circles. In FIG. 5B, a binary phase shift keying (BPSK) operation is illustrated using a square+sine input (black) with a voltage offset corresponding to Vmax. The output sine wave (blue) shows a phase shift compared to the input sine wave for each half of the square wave modulation. In FIG. 5C, a binary frequency shift keying (BFSK) operation is illustrated using a square+sine input (black) with a voltage offset away from the current maximum as indicated by the red circle in FIG. 5A. The frequency of the output signal (blue) can be doubled for every alternate modulation of the square wave.

In the anti-ambipolar BPSK circuit, FIGS. 5A-B and described more below, the output undergoes a phase shift at every edge of the square wave when the input Voffset is aligned with Vmax. In contrast to conventional Si integrated circuit technology that achieves this circuit function using a Gilbert cell having at least seven FETs, the anti-ambipolar implementation requires only one p-n heterojunction in series with one resistor. By changing Voffset and the input amplitude, another keying operation, e.g., binary frequency shift keying (BFSK), is demonstrated (FIG. 5C). BFSK achieves frequency doubling of the output AC signal in response to the input square wave, and is a special case of frequency modulation with applications in microwave radio and satellite transmission systems. The anti-ambipolar implementation can utilize considerably fewer circuit elements compared to conventional Si technology, thus simplifying circuit design and implementation.

The present s-SWCNT/a-IGZO p-n heterojunction demonstrates that van der Waals heterostructures are not limited to 2D semiconductors, which broadens the potential of this device. For example, the solution-processability and ambient-stability of s-SWCNTs and a-IGZO allow reproducible anti-ambipolar devices to be achieved over large areas on arbitrary substrates using established manufacturing methods. In this manner, a suite of telecommunications circuits have been implemented and can possess improved simplicity compared to established Si technology. Furthermore, this p-n heterojunction device geometry allows engineering of the anti-ambipolar transfer curve by appropriate choice of the constituent semiconductors and their respective threshold voltages, thus presenting additional opportunities for customization of the anti-ambipolar response for other circuits and systems. The device geometry may be optimized to minimize its lateral footprint and fringe capacitance, which can enable improvements in integration density and operating speed.

Materials synthesis and deposition can include a-IGZO films grown by spin-coating a combustion precursor solution and annealing on a hot plate at 300° C. for 10 min. The precursor solution includes In, Ga, and Zn nitrates dissolved in 2-methoxyethanol (0.05 mol L-1) with the addition of acetylacetone as a fuel and NH4OH to improve acetylacetone coordination to the metal. The In:Ga:Zn ratio of 72.5:7.5:20 can be chosen to optimize transistor performance. The total film thickness (~20 nm) can be achieved by four repeated spin-coating/annealing steps. The s-SWCNTs can be sorted using density gradient ultracentrifugation (DGU). Sorted s-SWCNT thin films can be prepared by vacuum filtration followed by thorough cleaning with DI water. SWCNTs films can then be transferred from a cellulose membrane onto device substrates using an acetone bath transfer technique.

Device fabrication and measurements can include Hafnia (15 nm) deposited on a degenerately doped silicon wafer using atomic layer deposition followed by solution deposition of a-IGZO. Four steps of photolithography can be used to: (1) Define Mo (100 nm) electrodes; Define a-IGZO channels using oxalic acid (10% in water); (3) Define Ti/Au (2 nm/50 nm) electrodes; (4) Define s-SWCNT channels via reactive ion etching (RIE) in O2. After the step of s-SWCNT RIE etching, the devices can be immersed in N-methyl-2-pyrrolidone at 80° C. for 40 min to further remove photoresist and other photolithography residues. All electrical measurements can be performed under ambient conditions in the dark using source-meter (Keithley 2400), waveform generator (Agilent 33500B), and oscilloscope (Agilent 54624A) instrumentation. The gate voltage can be limited to 4 V on the positive side to avoid irreversible breakdown of the hafnia dielectric.

Structural characterization of devices: All atomic force microscopy (AFM) images can be acquired in tapping mode using a Bruker Dimension ICON system. Scanning electron microscopy (SEM) images can be acquired with Hitachi SU8030 system at 2 kV using the secondary electron detector.

Figure 6:
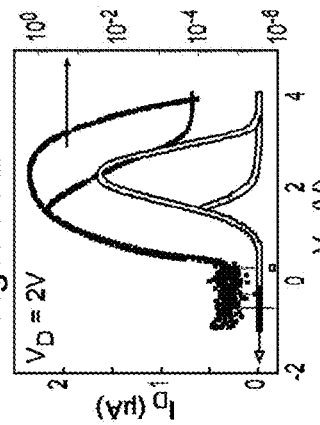
FIG. 6 is a graph illustrating optical absorbance spectra of large diameter s-SWCNTs (red) and unsorted carbon nanotubes (black).

FIG. 6 is a graph illustrating optical absorbance spectra of large diameter s-SWCNTs (red) and unsorted carbon nanotubes (black). The S22, S33 (semiconducting), and M11 (metallic) transitions are indicated by the pink and green shaded regions, respectively. The near elimination of the M11 transitions in the red spectrum indicates high semiconducting purity of the sorted material.

Material synthesis, deposition and characterization:

Arc discharge single-walled carbon nanotubes (e.g., P2, Carbon Solutions) can be used for the preparation of semiconducting single-walled carbon nanotubes (s-SWCNTs). For example, 45 mg of raw SWCNT powder can be added to 6.6 mL of 1% w/v aqueous sodium cholate (SC) solution in a glass vial and then sonicated using a horn ultrasonicator with a 0.125" diameter probe (Fisher Scientific 500 Sonic Dismembrator) for 1 hour at 20% of the maximum tip amplitude. Heating of the vial can be minimized through the use of an ice/water bath. Following sonication, additional 1% w/v aqueous SC and sodium dodecyl sulfate (SDS) solutions containing 60% w/v iodixanol can be added to the SWCNT dispersion to obtain a final iodixanol concentration of 32.5% w/v and surfactant ratio of 1:4 (SDS:SC). The SWCNT dispersion can be subsequently centrifuged at 3000 rpm for 3 minutes to eliminate large SWCNT aggregates and carbonaceous impurities. Then, 6 mL of the SWCNT dispersion wa can be inserted below 15 mL linear density gradient of 15-30% w/v iodixanol (1.08-1.16 g/ml) by using a syringe pump, and the remainder of the ultracentrifuge tube can be filled with 0% w/v iodixanol aqueous solution. The entire gradient contained a 1:4 ratio of 1% w/v SDS:SC. The linear density gradients can be then ultracentrifuged for 18 hours at 32 krpm in an SW 32 rotor (Beckman Coulter) at a temperature of 22° C. The resulting layer of s-SWCNTs at the top of the gradient can be extracted using a piston gradient fractionator (Biocomp Instruments).

The electronic purity of s-SWCNTs can be estimated by measuring their optical absorbance spectra with a Cary 5000 spectrophotometer (Agilent Technologies) (FIG. 6). For the measurement, the extracted SWCNT fractions can be diluted in disposable plastic cuvettes (Fisher Scientific). Reference solutions can be made with 1% w/v of SDS and SC (1:4 ratio) with addition of iodixanol for the baseline measurement. The electronic purity of the s-SWCNTs can be determined from their optical absorbance spectra after subtracting the π-plasmon resonance contributions and linear background with respect to energy, and then comparing the area of the second-order semiconducting peak (S22) to the first-order metallic peak (M11). The resulting semiconducting purity can be estimated to be ~99%.

Separate a-IGZO precursor solutions can be made for In, Ga and Zn using $In(NO_3)_3 \cdot 3H_2O$, $Ga(NO_3)_3 \cdot 8H_2O$, and $Zn(NO_3)_2 \cdot 6H_2O$, respectively, dissolved in anhydrous 2-methoxyethanol (0.05 mol $L^{-1}$). To these can be added acetylacetone (0.03125 mol L-1) and aqueous ammonium hydroxide (0.0425 mol $L^{-1}$) after which the solutions can be stirred overnight at room temperature. Prior to spin-coating, they can be combined in the correct molar ratio (In:Ga:Zn=72.5:7.5:20), stirred for an additional 1 hour, and filtered through a 0.2 μm PTFE filter. Spin coating can be carried out at 3500 rpm for 30 sec in air with <25% relative humidity after which the films can be immediately annealed at 300° C. on a hot plate for 10 min. This process can be repeated 4 times to give the overall required thickness.

Figure 7A:
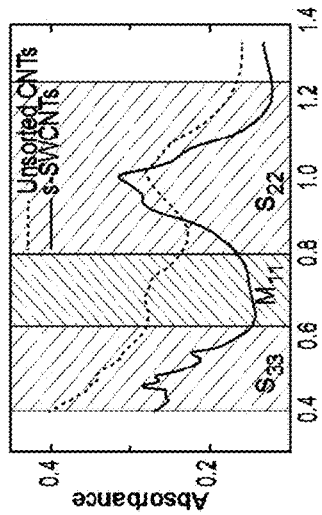
FIGS. 7A-F includes schematic and linear (blue) and semi-log (red) transfer plots of a p-type s-SWCNT FET.
Figure 7B:
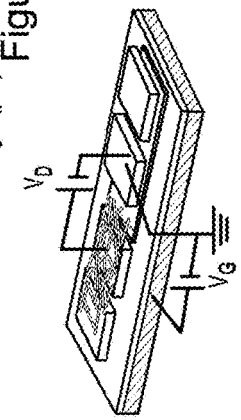
Figure 7C:
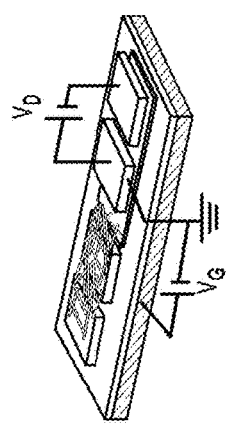
Figure 7D:
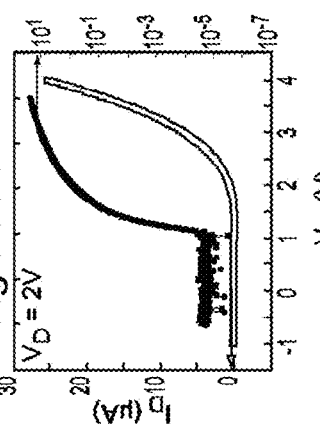
Figure 7E:
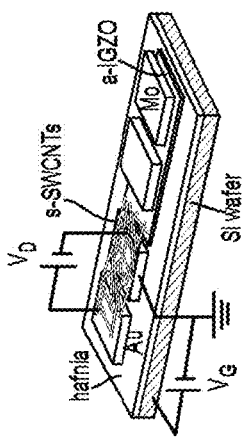
Figure 7F:
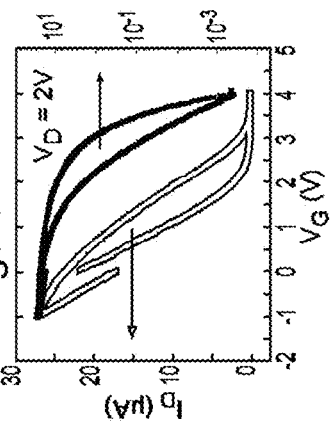

FIGS. 7A-B include a schematic and linear (blue) and semi-log (red) transfer plots of a p-type s-SWCNT FET. The field-effect mobility (μFE) can be estimated from the linear plot is ~1 cm2/V·s. FIGS. 7C-D include a schematic and linear (blue) and semi-log (red) transfer plots of a n-type a-IGZO FET. The field-effect mobility (μFE) estimated from the linear plot is ~1 cm2/V·s. FIGS. 7E-F include a schematic and linear (blue) and semi-log (red) transfer plots of a s-SWCNT/a-IGZO p-n heterojunction.

Device fabrication and electrical characterization:

Devices can be fabricated on heavily doped Si <100> (n-doped, resistivity=0.02 Ω-cm, WRS Materials) substrates. The as-received wafers can be sonicated in acetone followed by isopropanol for 5 min each and immediately blow dried in nitrogen. Atomic layer deposition (ALD) can be performed on the clean Si chips using a Savannah S100 ALD reactor (Cambridge Nanotech, Cambridge Mass.). The substrates can be loaded into the chamber, which can be pre☐heated to 100° C., and then the chamber temperature can be increased to 200° C. for the duration of growth. The samples can be exposed to sequential doses of the oxide precursor and deionized water interspersed with dry N2 purge steps between each precursor dose. The precursor for HfOx films can be tetrakis(dimethylamido)hafnium(IV) (TDMAHf, Aldrich, 99.99%), which can be maintained at a constant temperature of 75° C. A single ALD cycle consisted of a TDMAHf pulse for 0.25 s and a 10 s purge, followed by a H2O pulse for 0.015 s and another 10 s purge, which resulted in a growth rate of ~1 Å/cycle. These conditions can be used to grow ~15 nm thick HfOx, which has a capacitance of 730 nF/cm2.

a-IGZO can be deposited on the HfOx-coated Si substrates as described above in section S1. Photolithography (negative resist NR9-1000 PY, Futurex) can be performed using a standard mask aligner (Suss MAB-A6) to define electrode patterns on the a-IGZO followed by sputter deposition (AJA Orion) of Mo (~100 nm) and liftoff in n-methyl-2-pyrolidone (NMP). Subsequently, another photolithography step (positive resist, S1813 Shipley Microposit) can be used to define the a-IGZO patterns and etch them using a 10% oxalic acid in water solution. A third photolithography step (negative) allowed the Au electrodes to be defined for the s-SWCNT film. For example, a thermal evaporator can be used to evaporate 50 nm thick Au on top of a 2 nm thick Ti adhesion layer. The s-SWCNT films can be prepared by vacuum filtration through a cellulose membrane filter, which can be then stamped onto the substrates and held in an acetone bath. The density of nanotubes on the filter can be controlled by the amount of solution filtered through the membrane. Following a fourth photolithography step, reactive ion etching (Samco RIE-10 NR) in an oxygen plasma atmosphere (100 mW, 15 s, 20 sccm) can be used to define the nanotube channels. The resist can be subsequently dissolved in hot (80° C.) N-methyl-2-pyrrolidone for 2 h. No annealing step can be required for the s-SWCNT films or the final device.

Measurements can be carried out in ambient using a standard probe station with micromanipulators (Cascade Microtech), source meters (Keithley 2400), waveform generator (Agilent 33500B), and oscilloscope (Agilent 54624A). The schematic diagrams of the measurement set-ups are shown in FIG. 7a, c, e, while the corresponding transfer plots are provided in FIG. 7B, D, F. The hysteresis is noticeable in the transfer plot of the s-SWCNT FET (FIG. 7B), while it is negligible for the a-IGZO FET (FIG. 7D). The anti-ambipolar transfer plot of the junction also has noticeable hysteresis, particularly on the side where the s-SWCNTs are dominating the resistance. This asymmetric hysteresis provides further evidence of the anti-ambipolarity resulting from a series connection between s-SWCNTs and a-IGZO.

Figure 8:
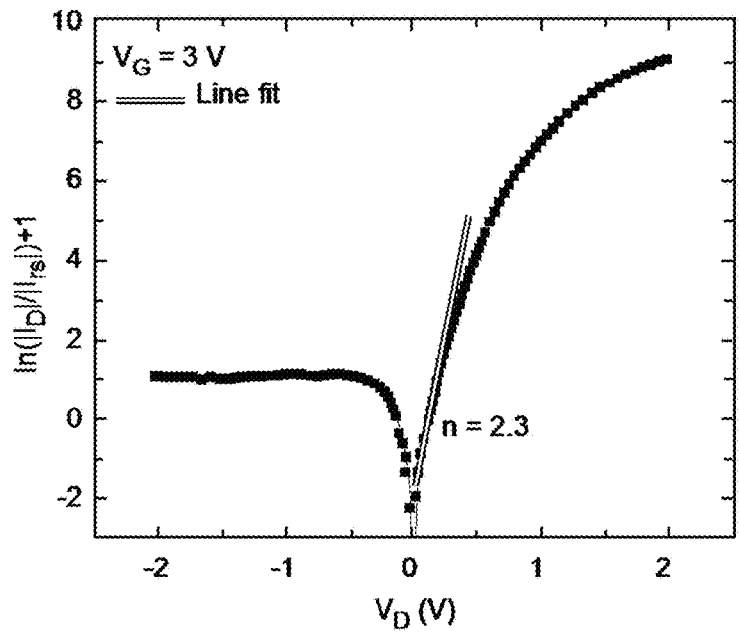
FIG. 8 is a graph illustrating an example reverse saturation current normalized semi-log output plot at VG-3 V.

FIG. 8 is a graph illustrating an example reverse saturation current normalized semi-log output plot at VG=3 V. The linear fit at low drain bias yields an ideality factor n=2.3.

Fitting output curve to the diode equation:

The output characteristics can be fit to the standard Shockley diode equation. The s-SWCNT/a-IGZO p-n heterojunction diodes possess an ideality factor of 2.3 for VG=3 V. The ideality factors can be >3 for the other gate voltages. Although the ideality factor is relatively large, it is still comparable or better than the recently reported 2D/2D black phosphorus/MoS2 p-n heterojunction diodes. The large ideality factor can likely be attributed to traps at the s-SWCNT/a-IGZO interface.

Figure 9A:
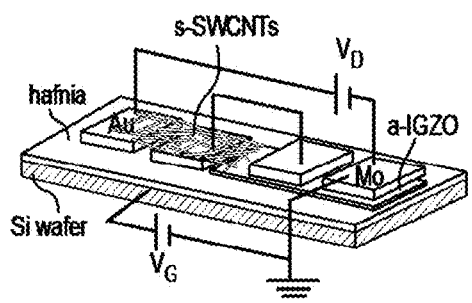
FIGS. 9A-C are a circuit and a graph for an example comparison of junction transfer characteristics with unipolar FETs in series.
Figure 9B:
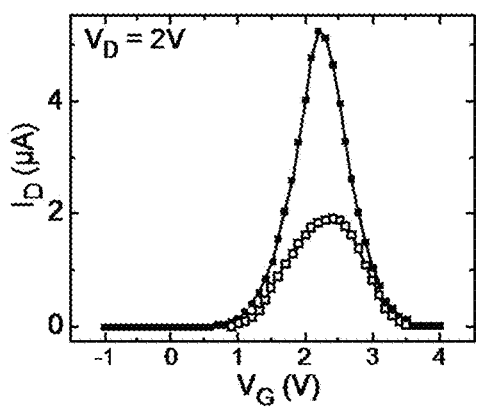
Figure 9C:
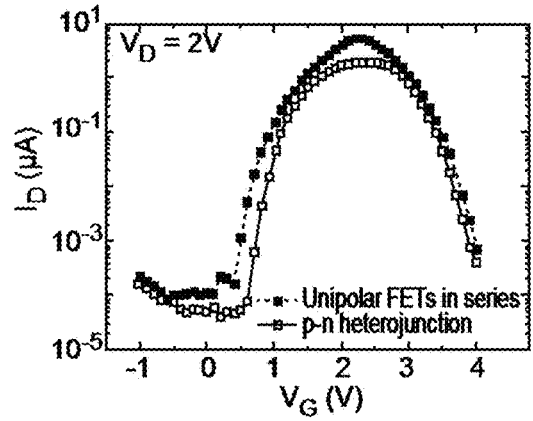

FIGS. 9A-C is a circuit and a graph for an example comparison of junction transfer characteristics with unipolar FETs in series. FIGS. 9A-B include a linear and part semi-log transfer characteristics. The differences in the magnitude of the peak current can be attributed to the junction resistance.

Measuring s-SWCNT and a-IGZO FETs in series:

The device geometry can allow to compare the junction transfer characteristics with the unipolar FETs on either side of the junction. Similarly, it allows to connect the two unipolar FETs in series by shorting the two electrodes of the junction externally with connecting wires (FIG. 9A). This arrangement eliminates the junction resistance (as well as the rectification property of the p-n heterojunction) while still giving an anti-ambipolar transfer behavior (FIG. 9B-C). The current in this configuration is higher than the junction current in the linear part of the transfer curve with the maximum current being more than twice that of the junction maximum. The gate voltage at the maximum current (Vmax) is nearly same (within 0.1 V) as that of the junction, which further confirms the hypothesis that the junction I-V is a result of two semiconductors in series with an additional voltage-tunable resistance at the junction interface. The series FET geometry, however, can be less scalable due to the larger lateral footprint of two FETs compared to a single junction. The additional contact in the series FET geometry can also contribute additional capacitance that can compromise the ultimate speed of a fully scaled device. Furthermore, the use of different contact metals for the two FETs complicates the design of the interconnect in the series FET geometry. Consequently, for high-performance electronics, the p-n heterojunction geometry can have significant advantages compared to series FETs.

Figure 10A:
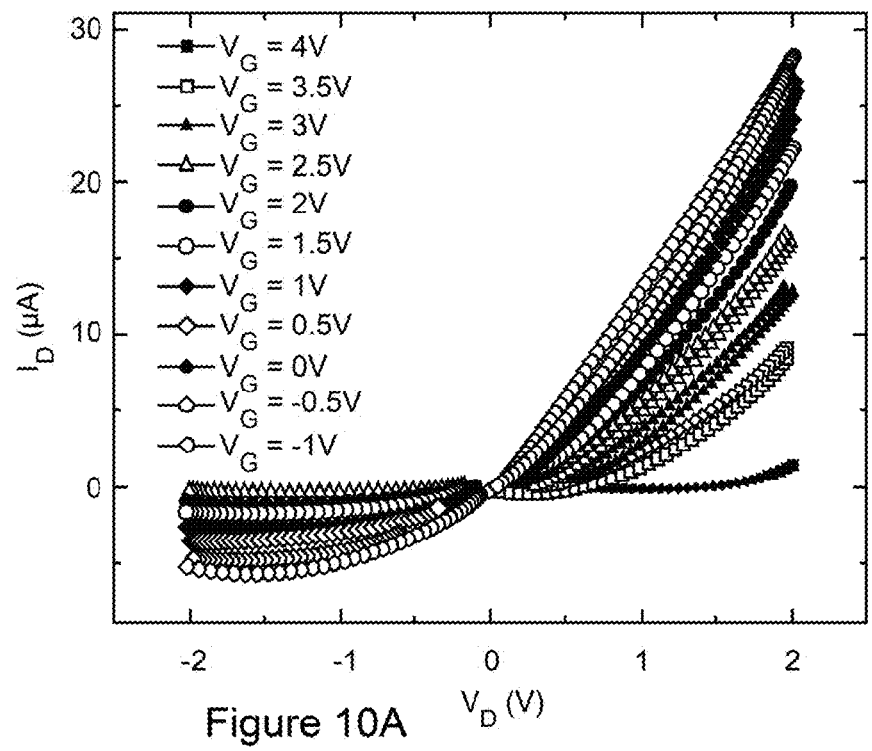
FIGS. 10A-B include a linear output plot of the network s-SWCNT FET (p-type) at varying gate biases and a linear output plot of the a-IGZO FET (n-type) at different gate biases.
Figure 10B:
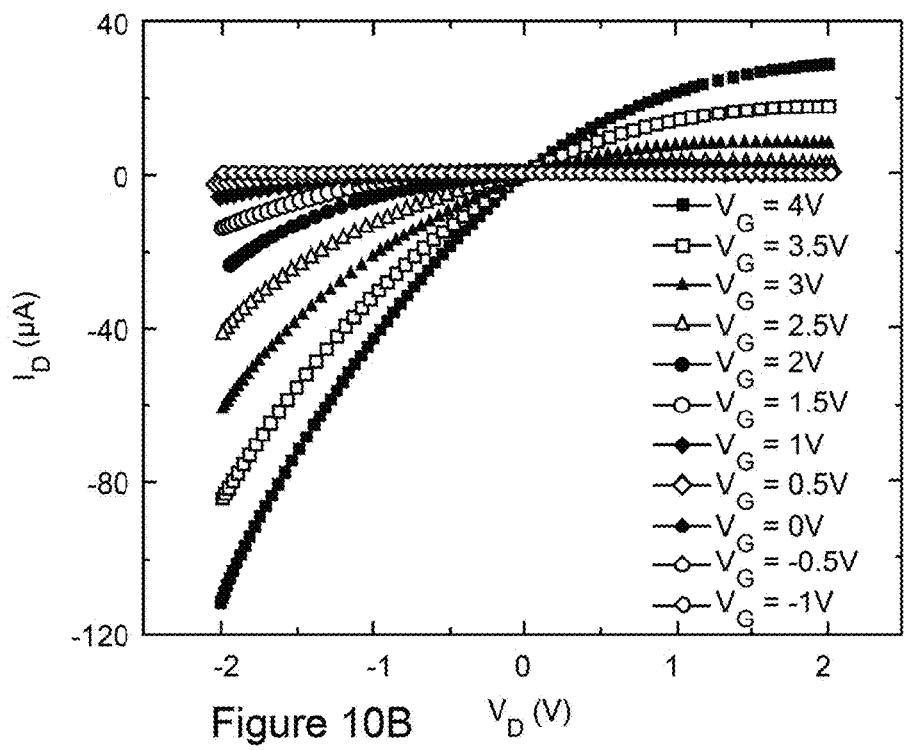

FIGS. 10A-B include a linear output plot of the network s-SWCNT FET (p-type) at varying gate biases and a linear output plot of the a-IGZO FET (n-type) at different gate biases.

ID-VD characteristics of unipolar FETs:

The output characteristics of the s-SWCNT and a-IGZO unipolar FETs (FIGS. 10A-B) at positive VD values resemble those of the junction in forward bias (FIG. 2D). At VG>Vmax (2.2 V), the junction current correlates with the linearly rising current of the s-SWCNT FET at positive VD (FIG. 10A). At VG<Vmax (2.2 V), the junction current shows saturation behavior similar to the a-IGZO FET output plot in FIG. 10B. Thus, the heterojunction current is dominated by the most resistive element (e.g., the one carrying the lower current) at any given voltage.

Figure 11:
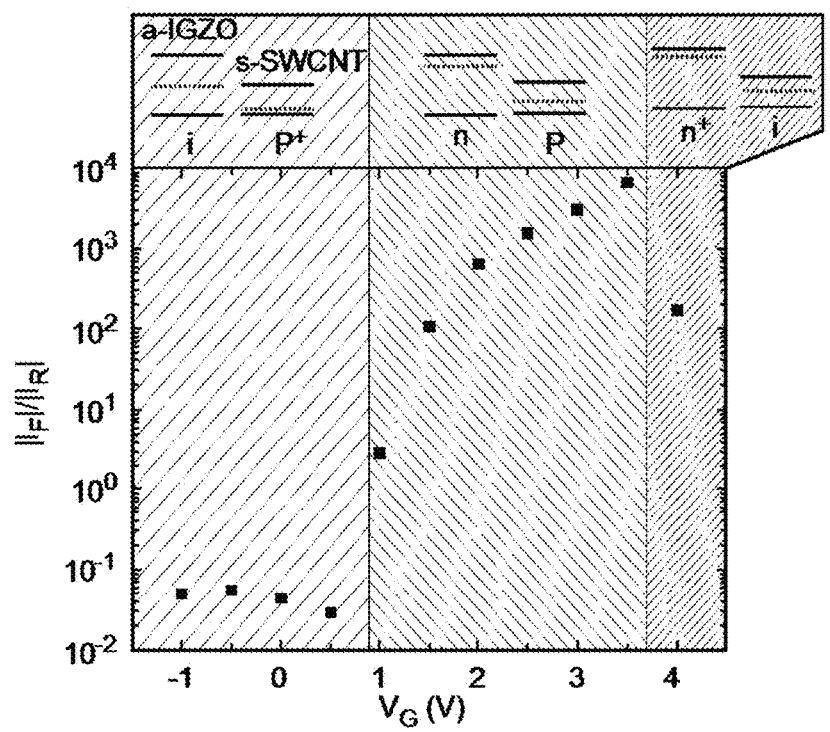
FIG. 11 is a graph of an example variation of rectification ratios (at $|V_D|=2$ V) as a function of gate voltage (VG) along with corresponding band alignments in the a-IGZO and s-SWCNTs in that range.

FIG. 11 is a graph of an example variation of rectification ratios (at |VD|=2 V) as a function of gate voltage (VG) along with corresponding band alignments in the a-IGZO and s-SWCNTs in that range.

Gate voltage dependence of rectification ratios, band alignments, and conduction mechanisms:

Due to the relatively large thickness (~20 nm) and high dielectric constant6 of the a-IGZO film, the band alignment at the junction is not subject to strong modulation by the gate electric field. This expectation is supported by the weak gate modulation of reverse saturation currents as shown in FIG. 2B. The gate dependence of the rectification ratios (e.g., the ratios of forward to reverse drain currents at the same bias magnitude) provides further insight into the conduction mechanism. Since the reverse bias current is not strongly modulated by the gate, the rectification ratios closely track the forward bias currents (e.g., the anti-ambipolar behavior). In FIG. 11, the rectification ratios are reduced at either extreme of the gate voltage with a maximum in the middle. From the perspective of gate-modulated doping, high positive VG causes the a-IGZO to be heavily n-doped while the s-SWCNTs are depleted to near intrinsic levels. For intermediate VG values, both the a-IGZO and s-SWCNTs have finite doping levels and hence substantial current flows at forward bias while current rectification occurs at reverse bias due to the built-in potential at the junction. Finally, at VG near 0 V and below, the a-IGZO is completely depleted. Due to the large band gap of a-IGZO, the depleted state of a-IGZO is highly insulating and thus minimizes current flow through the device.

Figure 12:
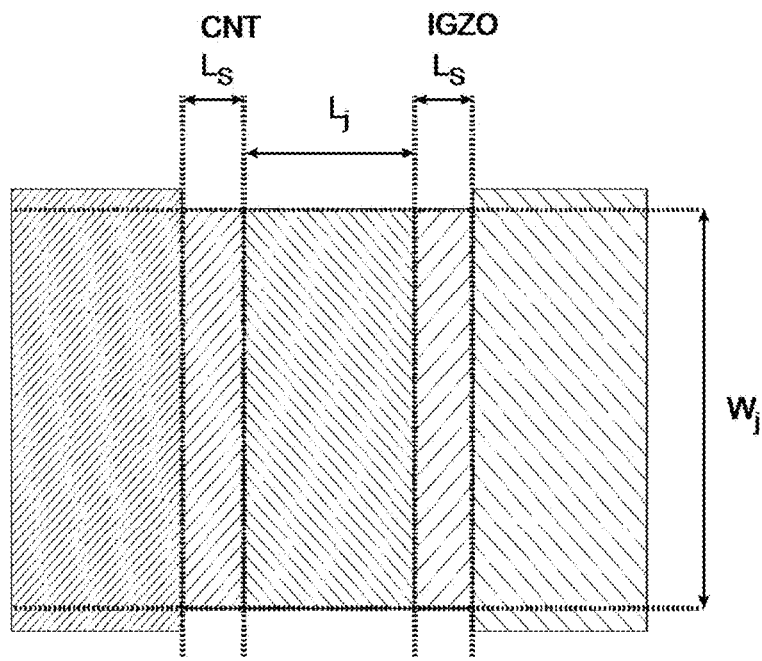
FIG. 12 is a schematic block diagram of an example s-SWCNT/a-IGZO junction.

FIG. 12 is a schematic block diagram of an example s-SWCNT/a-IGZO junction. The yellow and grey regions represent Au and Mo electrodes, respectively. The red and light blue regions represent s-SWCNTs and a-IGZO patterns while the overlapping area represents the junction. The schematic is similar to FIG. 1C.

Device dimensions and performance variability:

A basic block diagram of a s-SWCNT/a-IGZO junction is shown in FIG. 12. Lj and Wj represent the length and width of the junction while LSCNT and LSIGZO represent the series resistance lengths of s-SWCNT and a-IGZO films, respectively, which are fixed at 5 μm in the device array. Lj increases from 8 μm to 48 μm with increments of 5 μm over 9 columns. Wj increases from 50 μm to 140 μm with increments of 10 μm over 10 rows. The junction area (Aj=Lj*Wj) thus varies from 400 μm2 to 6720 μm2.

Variability in device performance can mainly result from variations in the structure of constituent semiconductor films. The a-IGZO, which is deposited via spin coating, is subject to thickness variations due to edge effects during spinning as well as variations in the wettability of the surface. The edge effect leads to a thicker a-IGZO film at the edges of the wafer/chip, thereby leading to higher off currents and lower on/off current ratios as illustrated in the histogram in FIG. 3C. The nanotube film on the other hand is deposited via vacuum filtration and acetone bath transfer as described in FIG. 7. The nanotubes are prone to bundling and agglomeration during filtration and transfer, which leads to inhomogeneities in tube density. Small variations in tube densities leads to variations in the electrical properties of the films.

Analysis of frequency doubling and binary phase shift keying circuits:

The power spectrum of the input and output signals of the frequency doubling circuit (FIG. 4C) can be obtained by taking their Fourier transforms. The area under the expected output frequency can be then evaluated as a percentage of the total output power. The desired output frequency of 20 Hz possessed about 94.5% of the total output power as compared to ~90% for graphene frequency multipliers. The s-SWCNT/a-IGZO anti-ambipolar heterojunctions are back gated and have a large device size, which can contribute significantly to the parasitic capacitance. Scaling down the device dimensions and introducing local gates (as has been done in the case of graphene) is expected to further improve the performance of s-SWCNT/a-IGZO heterojunctions as frequency doublers.

The phase shift in a binary phase shift keying (BPSK) circuit can be determined with respect to the input signal or within the output wave itself corresponding to the phase difference before and after the square wave modulation in the input signal. The phase shift is estimated by measuring distances between peaks before and at the modulation, taking their ratios and multiplying them by 360° or by comparing the change in position of crest and troughs. The phase difference between the input and output signal is 180° after the square modulation, although the phase shift (difference) in the output signal before and after the modulation is ~153°. This deviation from 180° is mainly due to the large capacitive coupling and slow response in the constituent semiconductors, which can be substantially reduced with reduced device dimensions and local gating. The deviation in this case has negligible impact on the function of the BPSK circuit.

The systems and methods described above may be implemented in many different ways in many different combinations of hardware, software firmware, or any combination thereof. In one example, the systems and methods can be implemented with a processor and a memory, where the memory stores instructions, which when executed by the processor, causes the processor to perform the systems and methods. The processor may mean any type of circuit such as, but not limited to, a microprocessor, a microcontroller, a graphics processor, a digital signal processor, or another processor. The processor may also be implemented with discrete logic or components, or a combination of other types of analog or digital circuitry, combined on a single integrated circuit or distributed among multiple integrated circuits. All or part of the logic described above may be implemented as instructions for execution by the processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. A product, such as a computer program product, may include a storage medium and computer readable instructions stored on the medium, which when executed in an endpoint, computer system, or other device, cause the device to perform operations according to any of the description above. The memory can be implemented with one or more hard drives, and/or one or more drives that handle removable media, such as diskettes, compact disks (CDs), digital video disks (DVDs), flash memory keys, and other removable media.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

We claim:

1. A method, comprising:
   depositing a dielectric on a doped silicon wafer followed by solution deposition of an n-type oxide; and
   performing photolithography for:
      defining a source electrode;
      defining n-type channels using oxalic acid;
      defining a drain electrode; and
      defining p-type nanomaterial channels, where a p-n heterojunction is defined by an overlap of the n-type oxide and the p-type nanomaterial channels.

2. The method of claim 1, where the p-type nanomaterial channels comprise semiconducting single-walled carbon nanotubes (s-SWCNT).

3. The method of claim 1, further comprising immersing in N-methyl-2-pyrrolidone to further remove photoresist and other photolithography residues.

4. The method of claim 1, where the n-type oxide comprises amorphous indium gallium zinc oxide (a-IGZO) thin films.

5. The method of claim 1, where the source electrode comprises a Mo electrode.

6. The method of claim 1, where the drain electrode comprises a Ti/Au electrode.

7. The method of claim 1, where the p-type nanomaterial channels are defined with reactive ion etching (RIE).

8. The method of claim 1, where the dielectric comprises hafnia.

9. The method of claim 1, where the dielectric is deposited on a degenerately doped silicon wafer using atomic layer deposition.

10. A method, comprising:
    defining an n-type oxide, wherein the n-type oxide is priorly formed by a solution deposition process over a dielectric layer covering a doped silicon wafer;
    defining a source electrode connected with the n-type oxide;
    defining a p-type nanomaterial;
    defining a drain electrode connected with the p-type nanomaterial; and defining a p-n heterojunction by overlapping the n-type oxide and the p-type nanomaterial.

11. The method of claim 10, where the gate-tunable p-n heterojunction comprises a p-type semiconducting single-walled carbon nanotube (s-SWCNT) of the p-type nanomaterial and an n-type oxide film of the n-type oxide.

12. The method of claim 11, where the n-type oxide film is amorphous.

13. The method of claim 11, where the s-SWCNTs and the n-type oxide film interact via van der Waals bonding.

14. The method of claim 10, where the gate-tunable p-n heterojunction provides an anti-ambipolar transfer characteristic.

15. The method of claim 10, further comprising providing a frequency doubler configured with a gate-tunable p-n heterojunction.

16. The method of claim 10, where the p-type nanomaterial and the n-type oxide comprise at least one solution processed and one vapor deposited.

17. The method of claim 15, wherein frequency doubling characteristics takes place when the gate-tunable p-n heterojunction is biased at a point of maximum current.

18. The method of claim 17, wherein charge transport of opposite carrier types in series takes place at the p-n heterojunction.

19. The method of claim 1, further comprising providing a frequency doubler configured with a gate-tunable p-n heterojunction biased at a point of maximum current.

20. The method of claim 19, wherein charge transport of opposite carrier types in series takes place at the p-n heterojunction.

* * * * *